(12) United States Patent
Takahashi

(10) Patent No.: US 7,304,356 B2
(45) Date of Patent: Dec. 4, 2007

(54) IGBT OR LIKE SEMICONDUCTOR DEVICE OF HIGH VOLTAGE-WITHSTANDING CAPABILITY

(75) Inventor: Tetsuya Takahashi, Niiza (JP)

(73) Assignee: Sanken Electric Co., Ltd. (JP)

( * ) Notice: Subject to any disclaimer, the term of this patent is extended or adjusted under 35 U.S.C. 154(b) by 0 days.

(21) Appl. No.: 11/432,907

(22) Filed: May 12, 2006

(65) Prior Publication Data

US 2006/0267091 A1    Nov. 30, 2006

(30) Foreign Application Priority Data

May 13, 2005    (JP)    ............................. 2005-141885

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ...................... 257/401; 257/328; 257/335; 257/339; 257/340; 257/341; 257/367; 257/409; 257/487; 257/488

(58) Field of Classification Search ................ 257/328, 257/335, 339, 367, 340–341, 401, 409, 487, 257/488

See application file for complete search history.

(56) References Cited

U.S. PATENT DOCUMENTS 6,057,558 A * 5/2000 Yamamoto et al. ........... 257/77
6,180,966 B1 * 1/2001 Kohno et al. ................ 257/173
6,218,217 B1 * 4/2001 Uenishi et al. ............. 438/138
6,462,377 B2 * 10/2002 Hurkx et al. ................ 257/339
6,667,515 B2 * 12/2003 Inoue .......................... 257/341
6,777,747 B2 * 8/2004 Yedinak et al. ............. 257/339
2005/0139909 A1 * 6/2005 Miura ......................... 257/330
2005/0199952 A1 * 9/2005 Hsieh et al. ................ 257/339

FOREIGN PATENT DOCUMENTS

JP    06-069509 A    3/1994

* cited by examiner

*Primary Examiner*—Ida M. Soward
(74) *Attorney, Agent, or Firm*—Woodcock Washburn, L

(57) ABSTRACT

A multiple-cell insulated-gate-bipolar-transistor chip is disclosed which includes a semiconductor substrate having formed therein a p$^+$-type collector region and an n$^-$-type base region, with a pn junction therebetween. An annular trench is etched in the substrate so as to surround the array of IGBT cells. Received in the trench are a dielectric layer which is held against the base region, and an electroconductive layer which is held against the base region via the dielectric layer and which is electrically coupled to the collector region. When the pn junction between the collector and base regions is reverse biased, the electroconductive layer creates at the annular periphery of the base region a depletion layer which is joined to a depletion layer created in the base region by the pn junction, thereby preventing current leakage from the side surfaces of the IGBT chip.

4 Claims, 6 Drawing Sheets

IGBT OR LIKE SEMICONDUCTOR DEVICE OF HIGH VOLTAGE-WITHSTANDING CAPABILITY

CROSS REFERENCE TO RELATED APPLICATIONS

This application claims priority to Japanese Patent Application No. 2005-141885, filed May 13, 2005.

BACKGROUND OF THE INVENTION

This invention relates to semiconductor devices such as an insulated-gate bipolar transistor (IGBT), and concerns more specifically how to enable such semiconductor devices to withstand higher voltages, particularly reverse voltages, than heretofore.

The IGBT such as that disclosed in Japanese Unexamined Patent Publication No. 6-69509 lends itself to use as a solid-state switch capable of self-extinction of arc. It can be turned on or off at any point on a sinusoidal waveform. Typical applications of the IGBT include, therefore, the AC switching of the matrix converter for induction motor speed control and the switching of AC power supplies.

Being subjected to both positive and negative half cycles of an alternating wave, the IGBT when used as an AC switch must be capable of withstanding sufficiently high voltages in both forward and reverse directions. The IGBT is generally weaker to reverse, than to forward, voltage. For AC switching, therefore, two IGBTs have been connected in parallel with each other for separately handling positive and negative currents, and a reverse-blocking diode has so far been connected in series with each IGBT in order to circumvent the noted weakness thereof. Use of the reverse-blocking diodes is of course objectionable for the conduction losses introduced thereby, which indeed have caused a significant diminution of the efficiency of the device incorporating the AC switch.

Attempts have been made for making the IGBT strong enough against reverse voltages to do without the reverse-blocking diodes. One such attempt is based upon the discovery that the insufficient strength of the conventional IGBT against the reverse voltage is due largely to current leakage from the side surfaces of each IGBT chip which are created upon dicing of the semiconductor wafer into individual chips with a diamond cutter. A conventional remedy for this deficiency was the provision of an antileakage layer on the side surfaces of the IGBT chip. The antileakage layer is formed by diffusion of impurities into part of the IGBT chip substrate, causing that part to gain the same conductivity type (e.g., p⁺) as the collector region of the IGBT. The resulting antileakage layer is joined directly to the collector region. Surrounding the base (drift) region in combination with the collector region, the antileakage layer serves to prevent the peripheries of the pn junction between the collector and base regions from being exposed at the side surfaces of the IGBT chip. Current leakage from the side surfaces was thus reduced, and the IGBT became stronger against reverse voltages.

However, this conventional remedy proved to possess its own weakness when applied to IGBTs designed to withstand as high a voltage as, say, 1200 volts. Such an extremely high voltage IGBT must have a base region as thick as 130 micrometers and necessitates the creation of an antileakage layer of matching depth. The creation of an antileakage layer to such a depth by diffusion was not only time-consuming but prone to give rise to crystal defects within the semiconductor substrate. Additionally, as the antileakage layer became deeper, so it also grew wider as a result of lateral diffusion that unavoidably accompanied the desired diffusion in the depth direction of the substrate, making the IGBT chip greater in overall size.

The instant applicant is aware that it has been known to create trenches between the individual devices fabricated on the semiconductor wafer and to fill the trenches with an insulator. These insulator-filled trenches are se not conducive to making the peripheries of the pn junction more resistive to voltages.

The difficulties discussed above are not limited to IGBTs. Similar problems have been encountered with other semiconductor devices such as bidirectional thyristors.

SUMMARY OF THE INVENTION

The present invention has it as an object to reduce, in a semiconductor device of the kind defined, current leakage from the periphery of the pn junction in the semiconductor substrate and hence to enable the device to withstand higher voltages, reverse voltages in particular, than heretofore.

Briefly, the invention may be summarized as a semiconductor device of improved voltage-withstanding capability, comprising a semiconductor substrate having a first and a second major surface and a side surface. The substrate has formed has formed therein a first semiconductor region of a first conductivity type which is exposed at the second major surface of the substrate, and a second semiconductor region of a second conductivity type, opposite to the first conductivity type, which is exposed at the first major surface of the substrate, so that there exists a junction of opposite conductivity types between the first and the second semiconductor region. A first electrode is formed on the first major surface of the substrate. A second electrode is formed on the second major surface of the substrate. A dielectric layer is formed on the side surface of the substrate and held against the second semiconductor region, and an electroconductive layer is formed on this dielectric layer and so held therethrough against the second semiconductor region. The dielectric layer is electrically coupled to the first semiconductor region of the substrate.

Typically, the invention is embodied in a multiple-cell IGBT chip including a semiconductor substrate having a first and a second major surface opposite to each other and a set of four side surfaces therebetween. An annular trench is formed in the first major surface of the substrate so as to surround an array of IGBT cells therein. Received in the annular trench are a dielectric layer received which is held against the second semiconductor region of the substrate, and an electroconductive layer which is held against the second semiconductor region via the dielectric layer and which is electrically coupled to the first semiconductor region of the substrate.

In use of the IGBT chip, when the pn junction between the two semiconductor regions of the substrate is reverse biased, the electroconductive layer within the annular trench functions as a field plate, creating an annular depletion layer in the second semiconductor region just inside the trench. This annular depletion layer is joined to the periphery of the depletion layer conventionally created in the second semiconductor region owing to the pn junction. Providing a zone of high resistance around the conventional depletion layer due to the pn junction, the annular depletion layer according to the invention serves to reduce current leakage from the side surfaces of the substrate.

As an additional advantage, the dielectric layer and electroconductive layer can be fabricated to a much less width than the prior art antileakage layer created by diffusion.

The above and other objects, features and advantages of this invention will become more apparent, and the invention itself will best be understood, from a study of the following description and appended claims, with reference had to the attached drawings showing the preferred embodiments of the invention.

DESCRIPTION OF THE PREFERRED EMBODIMENTS

Figure 1:
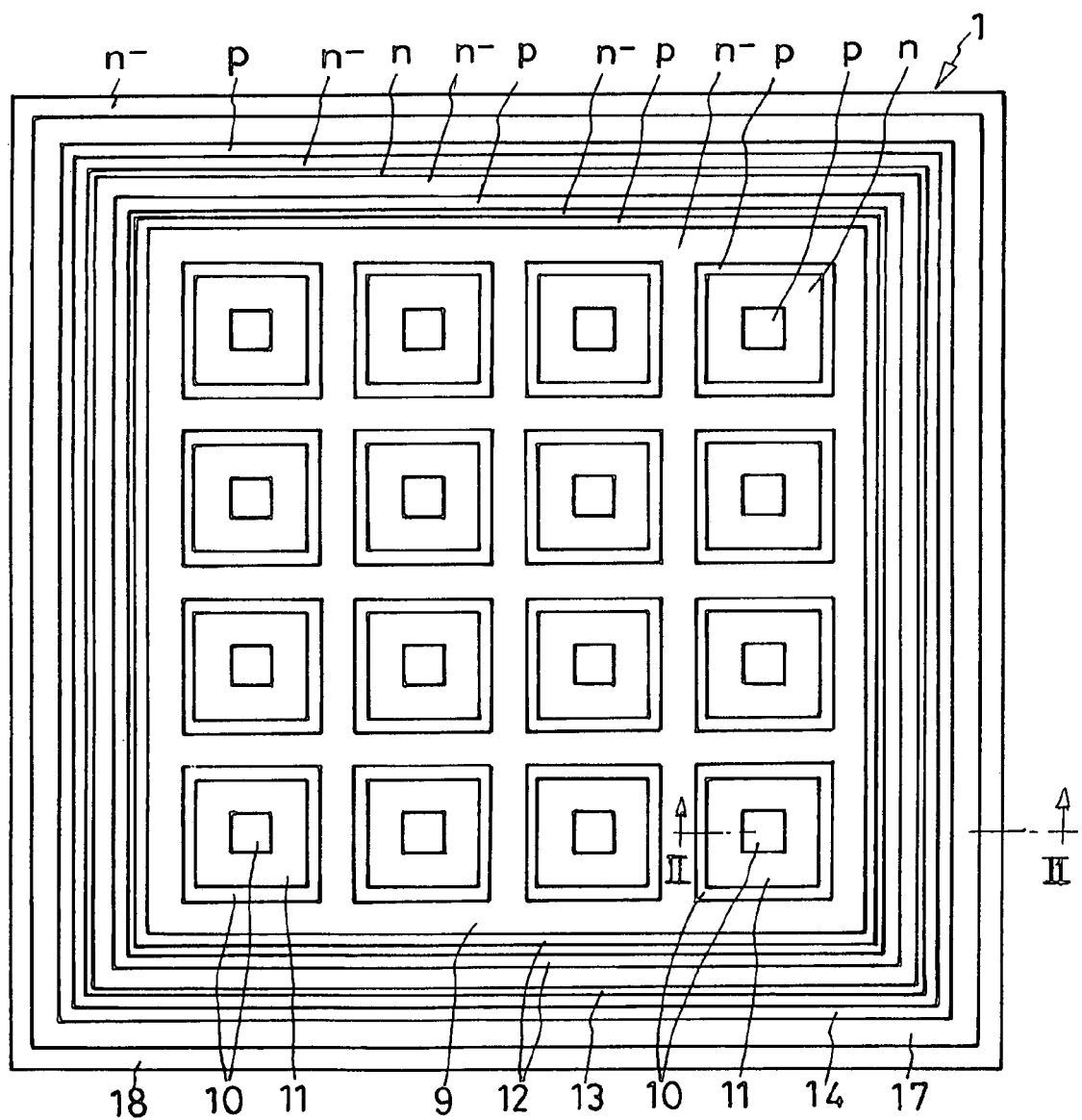
FIG. 1 is a plan view of the semiconductor substrate of a multiple-cell IGBT chip embodying the principles of this invention.
Figure 2:
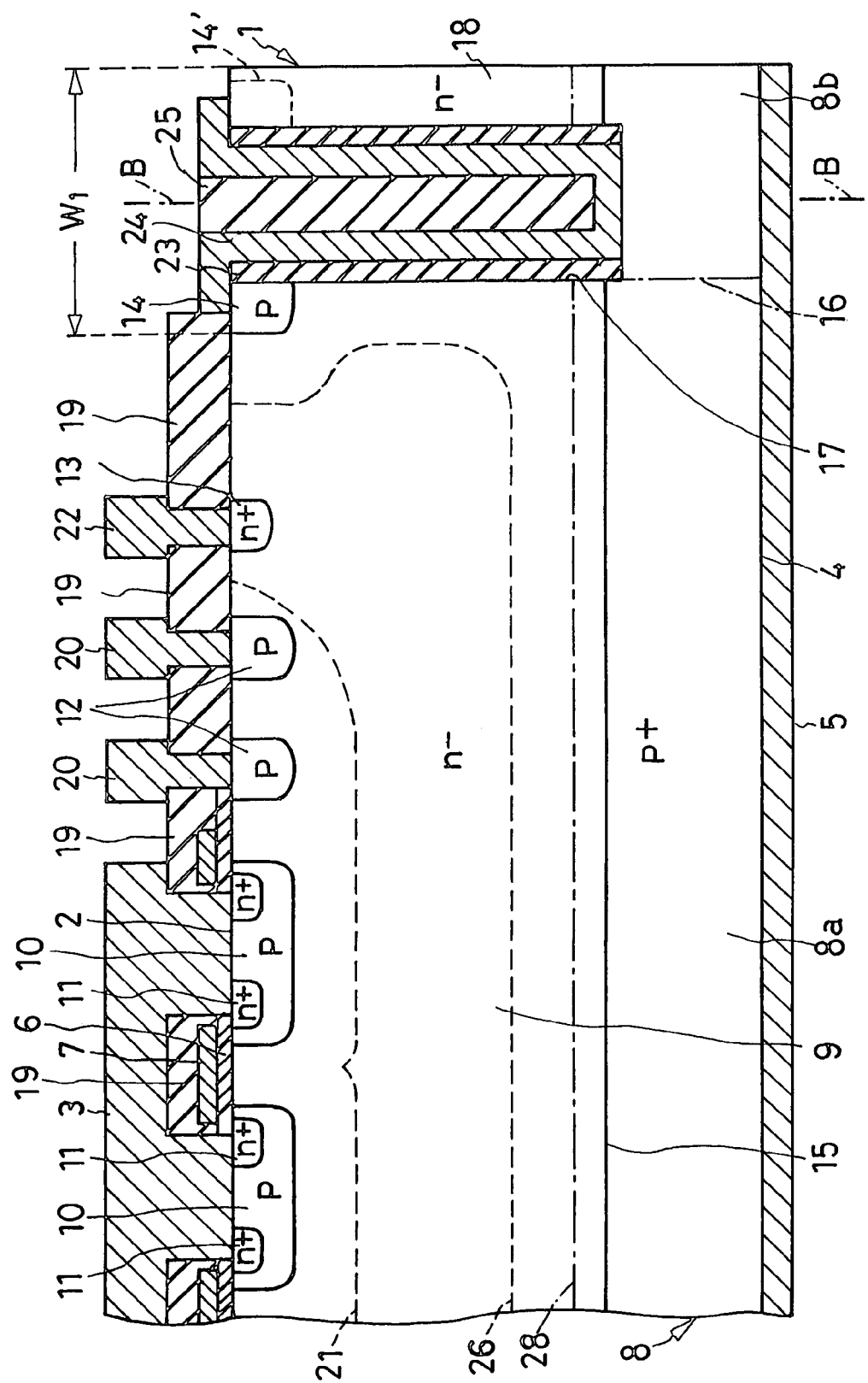
FIG. 2 is an enlarged, partial section through the IGBT chip substrate taken along the line II-II in FIG. 1 and shown complete with electrodes and internal structures of the annular trench in the substrate.

The invention is currently believed to be best embodied in the multiple-cell IGBT chip depicted in FIGS. 1 and 2. Broadly, the representative IGBT chip comprises:

1. A silicon or like semiconductor substrate 1 of generally flat, boxlike shape having a pair of opposite major surfaces 2 and 4 and a set of side surfaces therebetween, the substrate having semiconductor regions conventionally formed therein to provide a plurality of, sixteen in this embodiment, IGBT cells in an array.

2. An emitter electrode 3 as a first electrode on the first major surface 2 of the semiconductor substrate 1.

3. A collector electrode 5 as a second electrode on the second major surface 4 of the semiconductor substrate 1.

4. A gate electrode 7 formed on the first major surface 2 of the semiconductor substrate 1 via a gate insulator 6.

The IGBT chip is further equipped with means for greater strength against both forward and, in accord with the instant invention, reverse voltages. Such forward- and reverse-voltage-withstanding means will be set forth after the following more detailed account of the configuration of the semiconductor substrate 1 and the electrodes 3, 5 and 7 thereon.

With continued reference to both FIGS. 1 and 2 the semiconductor substrate 1 has formed therein:

1. A $p^+$-type collector region 8 as a first semiconductor region exposed at the second major surface 4 of the substrate.

2. An $n^-$-type base region 9 as a second semiconductor region overlying the collector region 8 and exposed at the first major surface 2 of the substrate.

3. An array of p-type base regions 10 formed to a relatively shallow depth from the first major surface 2 of the substrate in order to provide the IGBT cells. (The p-type base regions 10 will be hereinafter referred to as the cell base regions for contradistinction from the $n^-$-type base region 9, which will then be referred to as the substrate base region.)

4. An array of annular $n^+$-type emitter regions 11 formed one in each cell base region 10 and extending from the first major surface 2 of the substrate toward the second 4 to a depth less than that of the cell base region 10.

5. A plurality of, two in this embodiment, annular, spaced-apart, p-type guard rings 12 formed in the substrate 1 to a relatively shallow depth from its first major surface 2 and concentrically surrounding the array of cell base regions 10 for improvement of device strength against forward voltages. (The guard rings 12 will be hereinafter referred to as the forward guard rings.)

6. An $n^+$-type channel limiter ring 13 formed in the substrate 1 to a relatively shallow depth from its first major surface 2 and surrounding the forward guard rings 12 with a spacing therefrom.

7. An annular p-type guard ring 14 formed in the substrate 1 to a relatively shallow depth from its first major surface 2 and surrounding the channel limiter ring 13 with a spacing therefrom for improvement of device strength against reverse voltages. (These guard rings 14 will be hereinafter referred to as the reverse guard rings in contradistinction from the forward guard rings 12.)

The illustrated geometry and conductivity types of the constituent regions of the substrate 2 allows a variety of modifications without departure from the scope of this invention. For example, the collector region 8 might be of p, instead of $p^+$, type; the collector region 8 may be a combination of a $p^+$-type subregion placed closer to the collector electrode 5 and a p-type subregion lying closer to the substrate base region 9; and the cell base regions 10, forward guard rings 12, and reverse guard ring 14 might all be of $p^+$, instead of p, type.

Exposed at the second major surface 4 of the substrate 1, the collector region 8 is electrically coupled to the underlying metal-made collector electrode 5. The collector region 8 functions to supply holes to the overlying substrate base region 9 when the pn junction 15 between collector region 8 and substrate base region 9 is forward biased, thereby causing so-called conductivity modulation in the substrate base region. Functionally, therefore, the collector region 8 is divisible along the broken line 16 into a main portion $8_a$ underlying the substrate base region 9, and an annular marginal portion $8_b$ around the main portion. The marginal portion $8_b$ is utilized for improvement of device strength against reverse voltages according to the invention, as will become apparent as the description progresses. The collector region 8 as a whole serves the additional purpose as a basis on which the substrate base region 9 is grown by epitaxy.

The substrate base or drift region 9 has a donor concentration less than the acceptor concentration of the underlying collector region 8. The substrate base region 9 should be as thick as, say, 130 micrometers in order for the IGBT chip to gain sufficient strength against both forward and reverse voltages.

Bounding the periphery of the base region 9 is an annular trench 17 formed in the first major surface 2 of the substrate 1 so as to extend all along the side surfaces of the IGBT chip. The trench 17 extends from the first major surface 2 of the substrate 1 down into the collector region 8, terminating short of the second major surface 4. Created by anisotropic etching, the trench 17 has its pair of confronting wall surfaces extending substantially at right angles with the major surfaces 2 and 4 of the substrate 1. The trench 17 is shown extending into the collector region 8 but may not necessarily do so, all that is required being that this region 8 be exposed at the bottom of the trench. The trench 17 mostly overlies the annular marginal portion $8_b$ of the collector region 8, with the inside walls of the trench in register with the noted boundary 16 between the constituent portions $8_a$ and $8_b$ of the collector region. The internal makeup of the trench 17 will be detailed later.

The substrate 1 is further formed to include an annular marginal portion 18 on the outside of the trench 17 and over the marginal portion $8_b$ of the collector region 8. This marginal portion 18 was part of the substrate base region 9 before creation of the trench 17. Now, separated from the substrate base region 9 by the trench 17, the marginal portion 18 serves to mechanically protect the substrate base region and trench as well as the internal structures of the latter.

The array of cell base regions 10 are formed, each islandlike, centrally in the substrate base region 9. Each cell base region 10 has its bottom and side surfaces contiguous to the substrate base region 9 and its top exposed in part at the first major surface 2 of the substrate 1.

The annular emitter regions 11 are formed islandlike one in each cell base region 10, extending from the first major surface 2 of the substrate 1 and terminating short of the bottom of the cell base region. Thus, as seen in a plan view as in FIG. 1, each cell base region 10 is divided into a central and an annular peripheral portion which are joined to each other under the emitter region 11.

The emitter electrode 3 overlies the first major surface 2 of the substrate 1 in direct contact with both the emitter regions 11 and the central portions of the cell base regions 10. The emitter electrode 3 is metal made.

Made from polycrystalline silicon, or polysilicon, the gate electrode 7 is configured to overlie via the insulator 6 the annular peripheral portions of the cell base regions 10, leaving exposed at the first major surface 2 of the substrate 1 both the central portions of the cell base regions and the emitter regions 11. The gate electrode 7 is isolated from the overlying emitter electrode 3 by protective coverings 19 of electrically insulating material.

The forward guard rings 12 surround the complete array of IGBT cells for enhancement of device strength against forward voltages. Electrodes 20 are shown to overlie the forward guard rings 12 in direct contact therewith in order to enable the same to perform their function to the full. A certain potential may be applied to the electrodes 20.

In use of this multiple cell IGBT chip the pn junctions between n⁻-type substrate base region 9 and p-type cell base regions 10 will be reverse biased when the emitter electrode 3 is less in potential than the collector electrode 5 and, at the same time, when no voltage is being impressed to the gate electrode 7 to turn the IGBTs on. Then, as indicated by the dashed line labeled 21 in FIG. 2, a depletion layer will be created, spreading, so to say, from the array of cell base regions 10 into the underlying substrate base region 9. Were it not for the forward guard rings 12, breakdown due to field concentration would be particularly liable to occur at the periphery of the depletion layer 21. The forward guard rings 12 serve to cause the depletion layer to be so gently contoured at its periphery as to prevent any excessive field concentration and so assure greater immunity to forward voltages.

Disposed just outside the forward guard rings 12, the channel limiter ring 13 serves to prevent the unnecessary expansion of the depletion layer. An electrode 22 overlies the channel limiter ring 13 in direct contact therewith. A voltage might be applied as required to the electrode 22 in order to hold the same at a stable potential.

The first major surface 2 of the substrate 1 has some peripheral parts left exposed by the electrodes 3, 20 and 22. A protective covering 19 of electrically insulating material is deposited on such exposed parts of the substrate surface 2.

The reverse guard ring 14 has its outside surface exposed to the trench 17, its bottom and inside surfaces contiguous to the substrate base region 9, and its top surface exposed at the first major surface 2 of the substrate 1. The reverse guard ring 14 is capable of fabrication by diffusion at the same time with that of the cell base regions 10 and forward guard rings 12. The illustrated placement of the reverse guard ring 14 on the inside only of the trench 17 is not essential; instead; as indicated by the broken line in FIG. 2, the reverse guard ring may extend across the trench to its outer side.

Received in the trench 17 are:

1. Dielectric layers 23 held directly against the pair of confronting side walls of the trench 17.

2. An electroconductive layer 24 of U-shaped cross section held against the pair of confronting side walls of the trench 17 via the dielectric layers 23 and directly against the bottom of the trench.

3. A filling 25 received in the electroconductive layer 24.

The dielectric layers 23 cover both inside and outside walls of the trench 17, but not its bottom. These dielectric layers 23 may be formed first by depositing an electrically insulating material such as silicon dioxide on both side walls and bottom of the trench 17, or oxidizing these trench surfaces, and then by removing the resulting dielectric layer from the trench bottom by anisotropic etching. The remaining dielectric layers 23 on the trench side walls should be sufficiently thick to provide a desired reverse voltage by virtue of the familiar field plate effect. The dielectric layers 23 may be made from the same material and at the same manufacturing step as the gate insulator 6 for expediting the process of fabrication.

The electroconductive layer 24 is mostly received in the trench 17 and partly overlies the first major surface 2 of the substrate 1 so as to surround the entrance end of the trench. For providing the field plate effect the electroconductive layer 24 is made from metal or from polysilicon rendered electroconductive as by the doping of boron. The electroconductive layer 24 is formed to include a portion held against the base region 9 via the dielectric layers 23, a portion held directly against the collector region 8, and a portion held directly against the reverse guard ring 14. The electroconductive layer 24 may be made from the same material and the same manufacturing step as the gate electrode 7. The electroconductive layer 24 may have part of its bottom removed while being still held in electrical contact therewith.

Made from highly electrically resistive material or polysilicon dielectric, the filling 25 serves to protect the trench 17 mechanically and the electroconductive layer 24 chemically. The provision of the filling 25 is not an absolute requirement, however, so that the electroconductive layer 24 might be made solid instead of being U shaped in cross section, thereby eliminating the filling 25. If employed at all, the filling 25 may be made from the same material and at the same manufacturing step as the protective coverings 19.

Operation

In its use in an AC circuit the multiple-cell IGBT chip of FIGS. 1 and 2 has both forwardly operating periods, in which the collector electrode 5 is higher in potential than the emitter electrode 3, and reversely operating periods in which the collector electrode is less in potential than the emitter electrode. Channels will be created on the surfaces of the cell base regions 10 when a control signal is impressed to the gate electrode 7 to cause conduction through the IGBT chip during the forwardly operating periods. The result will be the flow of current along the path comprising the collector electrode 5, p$^+$-type collector region 8, n$^-$-type substrate base region 9, channels of the p-type cell base regions 10, n$^+$-type emitter regions 11, and emitter electrode 3.

No channels will be created on the cell base regions 10 when no conduction-causing control signal is being impressed to the gate electrode 7 during the forwardly operating periods. As a consequence, the pn junction between p-type cell base regions 10 and n$^-$-type substrate base region 9 will be subjected to a relatively high reverse bias voltage, with the result that the depletion layer 21 is created which extends from the pn junction into the substrate base region 9. The forward guard rings 12 function as above explained to smooth the periphery of this pn junction, preventing breakdown due to field concentrations and so improving strength against forward voltages.

During the reversely operating periods, on the other hand, the pn junction 15 between p$^+$-type collector region 8 and n$^-$-type substrate base region 9 will be reverse biased, with the consequent creation of the depletion layer indicated by the broken line 26 in FIG. 2. A closer inspection of this figure will reveal that the depletion layer 26 is an integral, streamlined combination of a part (due to the pn junction 15) extending from this pn junction into the n$^-$-type substrate base region 9, a part (due to the field plate effect of the dielectric layers 23 and electroconductive layer 24 in the trench 17) extending from this trench into the substrate base region 9, and a part (due to the reverse guard ring 14) extending from this guard ring into the substrate base region 9.

Although the pn junction 15 is peripherally open to the trench 17, the depletion layer 26 will not terminate at this trench. Instead, thanks to the field plate effect of the dielectric layers 23 and electroconductive layer 42 inside the trench 17, the depletion layer 26 will extend up to the first major surface 2 of the substrate 1. It will also be appreciated that the depletion layer 26 smoothly and stably extends from the reverse guard ring 14 into and throughout the substrate base region 9. This is because, being electrically connected to the underlying collector region 8 via the electroconductive layer 24 within the trench 17, the reverse guard ring 14 has approximately the same potential as does the collector region 8.

What follows is a list of advantages gained by the above described embodiment of the invention:

1. Surrounding the substrate base region 9 via the dielectric layer 23, the electroconductive layer 24 offers the field plate effect, such that the depletion layer 26 created during the reversely operating periods does not terminate at the sides of the base region but extends up to the first major surface 2 of the substrate 1. Current leakage from this first major surface of the substrate is negligible compared to the conventional leakage from the sides, created by dicing, of the substrate. Thus is the IGBT chip made stronger against reverse voltages than heretofore.

2. The reverse guard ring 14 assures the termination of the depletion layer 26 at the first major surface 2 of the substrate instead of at the sides of the substrate base region 9.

3. The transverse dimension $W_1$ between the inside edge of the reverse guard ring 14 and the side of the substrate 1 can be made less than the corresponding dimension of the noted prior art antileakage layer created by diffusion of impurities into the substrate. The IGBT chip may therefore be made less in size but stronger against reverse voltages than its conventional counterpart having the antileakage layer.

4. The trench 17 with its internal structures 23 and 24 takes less time for creation than the prior art antileakage layer.

5. The creation of the trench 17 with its internal structures 23 and 24 gives rise to less crystal defects in the substrate 1 than does that of the prior art antileakage layer.

6. Additionally incorporating the forward guard rings 12, the IGBT chip is well equipped for high strength against both forward and reverse voltages. Therefore, in applications where two such IGBT chips are interconnected in inverse-parallel for AC switching, the noted prior art reverse blocking diodes are unnecessary.

Figure 3:
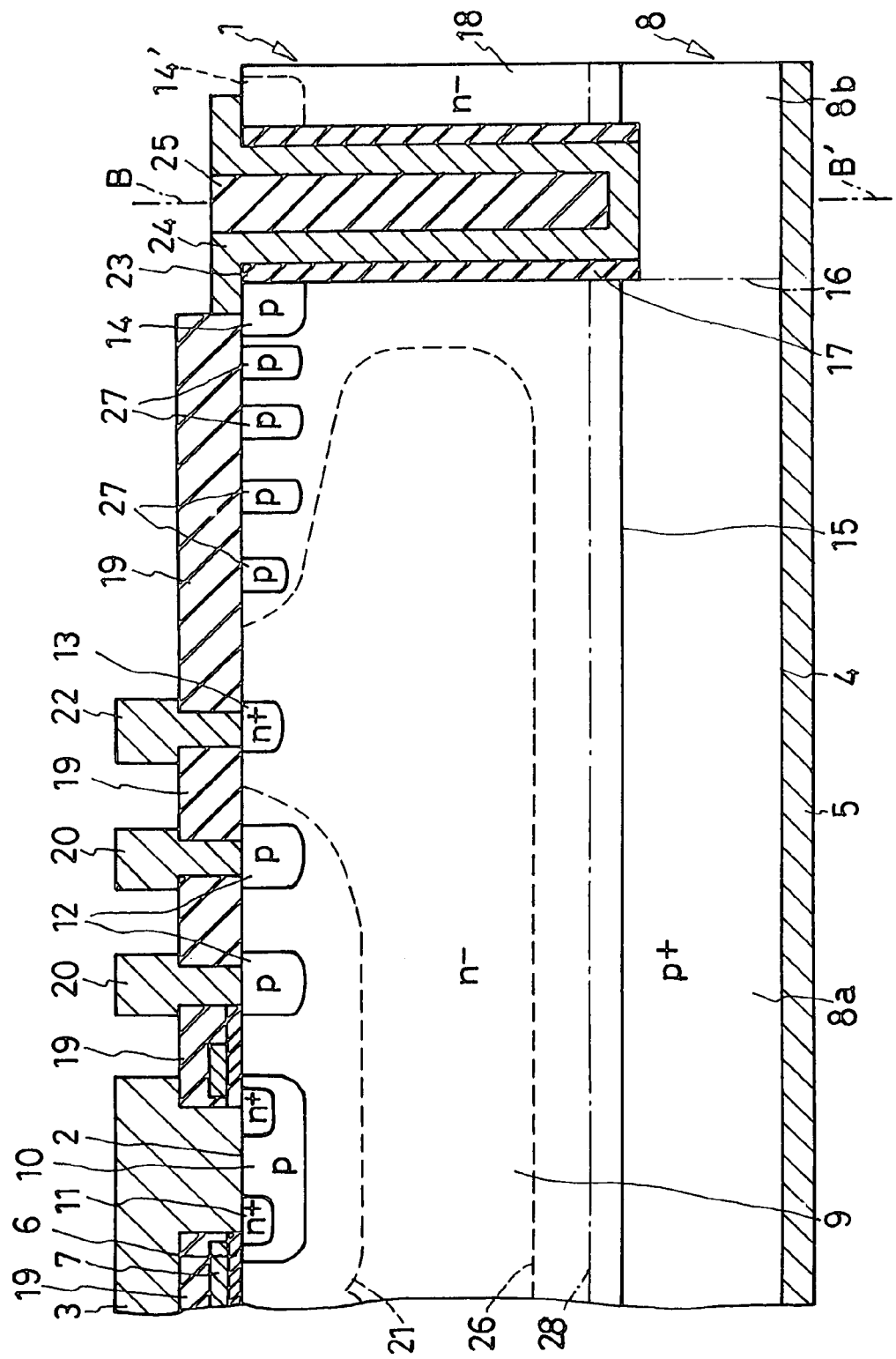
FIG. 3 is a view similar to FIG. 2 but showing another preferred form of IGBT chip according to the invention.

Embodiment of FIG. 3

The second preferred form of multiple-cell IGBT chip shown in FIG. 3 features an additional set of, four in this embodiment, p-type reverse guard rings 27, all the other details of construction being as previously set forth in connection with FIGS. 1 and 2. The additional reverse guard rings 27 extend from the first major surface 2 of the substrate 1 down into the substrate base region 9 to relatively shallow depths. Disposed concentrically between the channel limiter ring 13 and the preexisting reverse guard ring 14, the additional reverse guard rings 27 thoroughly encircle the array of IGBT cells comprised of the islandlike cell base regions 10 and annular emitter regions 11.

As will be understood from a closer examination of FIG. 3, the additional reverse guard rings 27 have progressively greater spacings from one to the next as they approach the channel limiter ring 13. Further the inmost additional reverse guard ring 27, placed closest to the channel limiter ring 13, is shallower than the other additional reverse guard rings 27, which are shown to be of the same depth with one another and with the preexisting reverse guard ring 14.

However, the illustrated arrangement, depths, and number of the additional reverse guard rings 27 are by way of example only. In practice, for example, the additional reverse guard rings may be made either progressively shallower from trench 17 toward channel limiter ring 13 or all the same in depth. Also, greater or less than four additional reverse guard rings 27 may be employed, and the same spacing may be provided between all such additional reverse guard rings.

The additional reverse guard rings 27 serve as the known field limiting rings, mitigating field concentrations at the periphery of the depletion layer 26 and so enabling the IGBT chip to withstand higher voltages. An electrode may be coupled, either directly or via the dielectric layer 23 to the reverse guard rings as required or desired for maintaining them at a constant potential.

Figure 4:
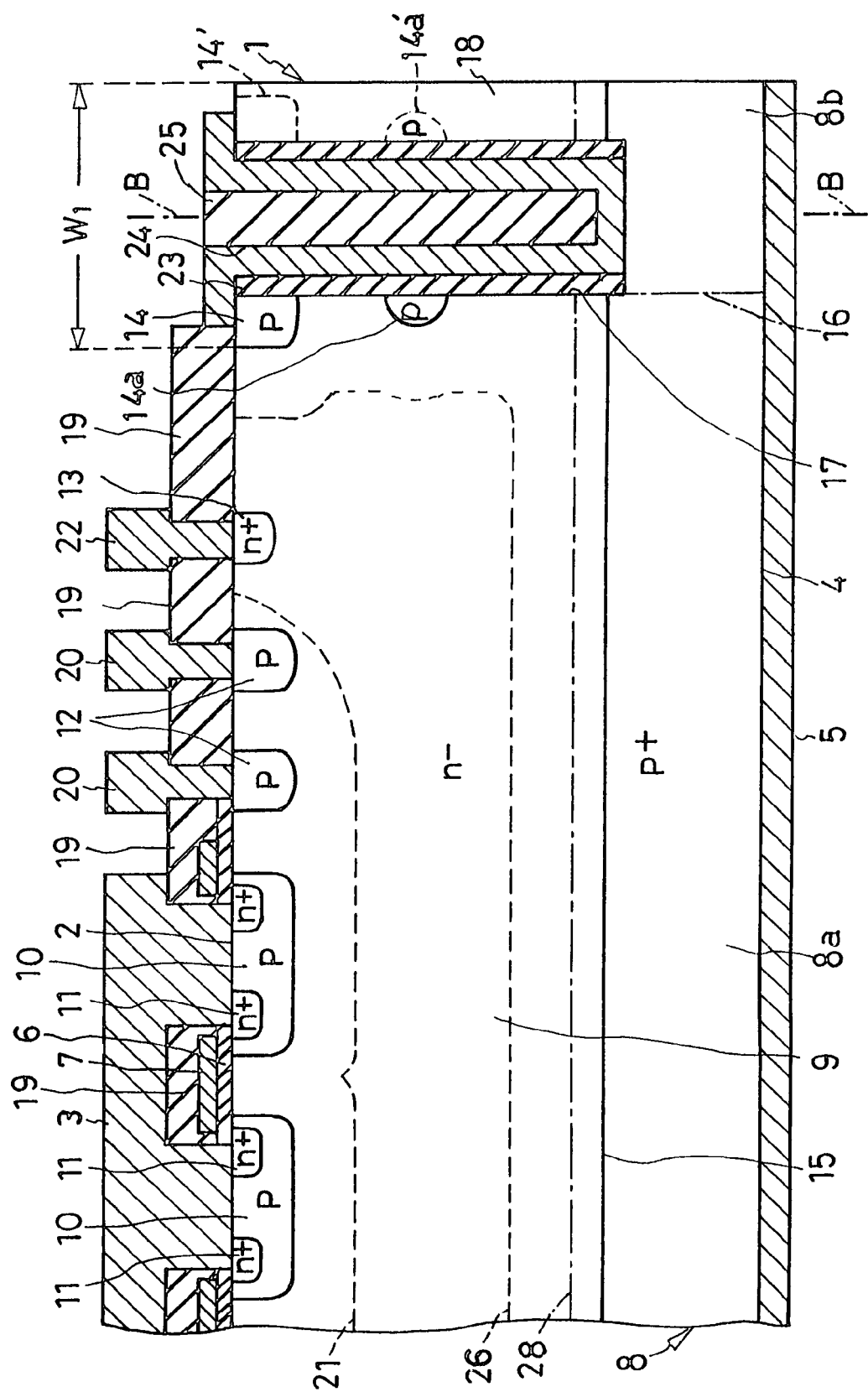
FIG. 4 is a view similar to FIG. 2 but showing still another preferred form of IGBT chip according to the invention.

Embodiment of FIG. 4

This embodiment differs from that of FIGS. 1 and 2 only in incorporating a second p-type reverse guard ring $14_a$ spaced downwardly from the preexisting first p-type reverse guard ring 14. Placed approximately in the middle of the trench 17 with respect to its depth direction, the second reverse guard ring $14_a$ extends from the inside wall surface of the trench a relatively small distance into the n$^-$-type substrate base region 9. Thus the second reverse guard ring 14$_a$ is contiguous both to the dielectric layer 23 within the trench 17 and to the substrate base region 9.

In order to create the second reverse guard ring 14$_a$ the trench 17 may first be etched to half its required final depth. Then a p-type impurity may be diffused both laterally and downwardly from the bottom of the half-depth trench. Then the trench may be further etched through part of the diffused p-type impurity region to its full depth. Fashioned in this manner, the second reverse guard ring 14$_a$ may surround the trench 17, as indicated by the dashed line labeled 14$_a$' in FIG. 4.

The second reverse guard ring 14$_a$ functions just like the first reverse guard ring 14 to maintain the inside boundary of the trench 17 at a desired potential. A comparison of FIGS. 2 and 4 will indicate that the depletion layer 26 due to the pn junction 15 is made broader as it extends upwardly through the substrate base region 9 toward the first major surface 2 of the substrate 1.

This embodiment is subject to modifications in which two or more such additional reverse guard rings 14$_a$ are formed on the inside of the trench 17. Furthermore, one or more such additional reverse guard rings 14$_a$ may be put to combined use with the additional reverse guard rings 27 of FIG. 3.

Figure 5:
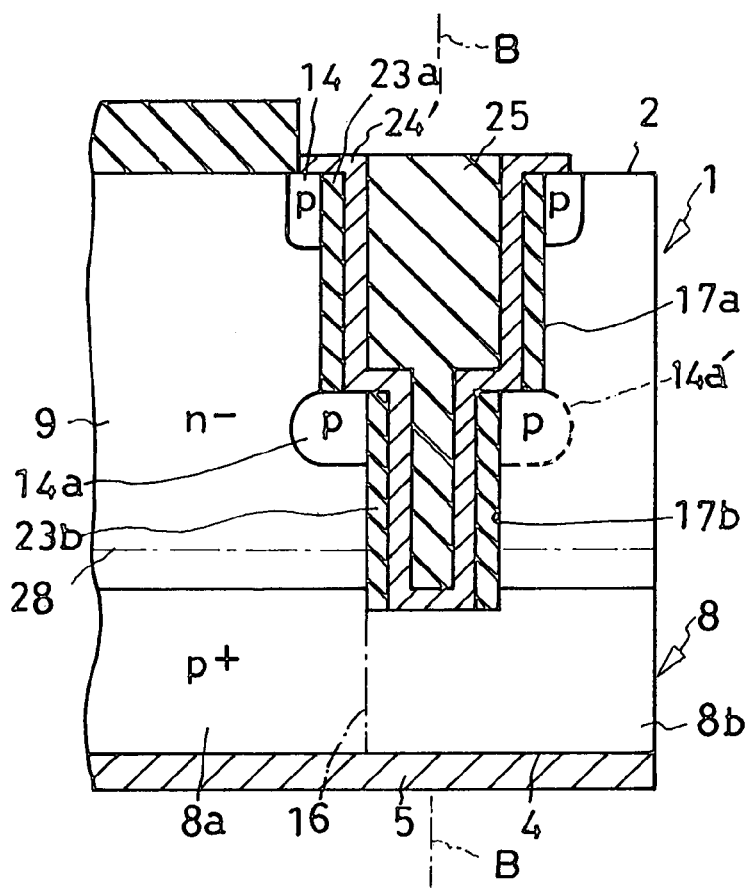
FIG. 5 is a view somewhat similar to FIG. 2 but showing yet another preferred form of IGBT chip according to the invention.

Embodiment of FIG. 5

In FIG. 5 is shown the trench divided into a relatively wide upper portion 17$_a$ and a narrower lower portion 17$_b$. The upper trench portion 17$_a$ extends from the first major surface 2 of the substrate 1 to approximately half the depth of the substrate base region 9. The lower trench portion 17$_b$ extends from the bottom of the upper trench portion 17$_a$ through the substrate base region 9 down into the collector region 8 to a relatively small depth. The pair of confronting side walls of the upper trench portion 17$_a$ are covered by dielectric layers 23$_a$, and those of the lower trench portion 17$_b$ by dielectric layers 23$_b$. An electroconductive layer 24' of substantially U-shaped cross section is held against all of the dielectric layers 23$_a$ and 23$_b$, the collector region 8, and the two reverse guard rings 14 and 14$_a$. The second reverse guard ring 14$_a$ is shown formed at least on the inside of the lower trench portion 17$_b$, just under the step between the two trench portions 17$_a$ and 17$_b$. All the other details of construction are as previously set forth with reference to FIGS. 1, 2 and 4.

For creating the trench and associated parts of the FIG. 5 embodiment, the upper trench portion 17$_a$ may first be etched in the substrate 1 to the required depth from its first major surface 2. Then a p-type impurity may be diffused into the base region 9 from the bottom of the upper trench portion 17$_a$ thereby fabricating the second reverse guard ring 14$_a$. Then the lower trench portion 17$_b$ may be etched from the bottom of the upper trench portion 17$_a$ through the second reverse guard ring 14$_a$ down into the collector region 8. Then the dielectric layers 23$_a$ and 23$_b$ may be formed on the side walls and bottoms of the upper and lower trench portions 17$_a$ and 17$_b$ and thereafter removed from the bottoms of both trench portions 17$_a$ and 17$_b$. Then the electroconductive layer 24' may be formed on the entire surfaces of the dielectric layers 23$_a$ and 23$_b$, on the exposed bottoms of both trench portions 17$_a$ and 17$_b$, and on neighboring parts of the first major surface 1 of the substrate 1. Both first and second reverse guard rings 14 and 14$_a$ will then be electrically connected to the collector region 8 via the electroconductive layer 24'.

Unlike its FIG. 4 counterpart bearing the same reference characters, the second reverse guard ring 14$_a$ of this FIG. 5 embodiment is electrically coupled to the collector region 8. Thus held at a fixed potential, the second reverse guard ring 14$_a$ will better serve its intended purpose which has been explained with reference to FIG. 4.

Figure 6:
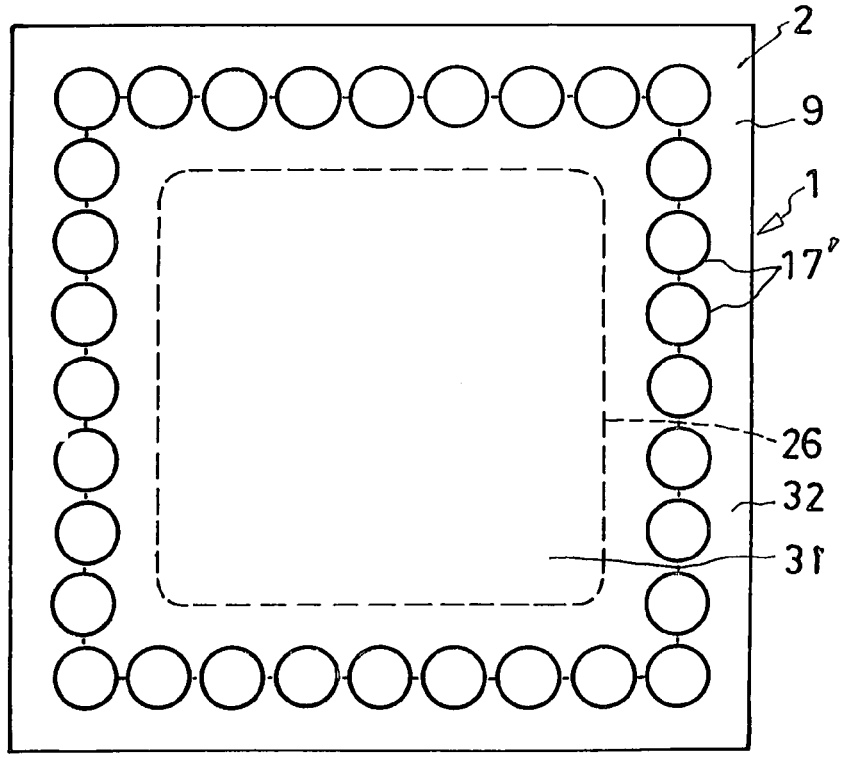
FIG. 6 is a diagrammatic plan view of a modified semiconductor substrate for use in an IGBT chip according to the invention.

Embodiment of FIG. 6

The annular trench of all the foregoing embodiments is replaceable by an annular row of upstanding, parallel bores, as illustrated in a plan view in FIG. 6 and therein designated 17'. Each circular in cross sectional shape, the bores 17' extend from the first major surface of the substrate 1 toward the second to the same depth as does the trench 17 of FIGS. 1 and 2. The bores 17' are positioned sufficiently close to one another to perform in combination substantially the same functions as does the continuous trench 17 of the foregoing embodiments.

The annular row of bores 17' as a whole is also similar in placement to the trench 17. Although the IGBT chip is shown greatly simplified in FIG. 6, it will nevertheless be seen that the IGBT cells are to be arrayed in central part 31 of the first major surface 2 of the substrate 1 or of the substrate base region 9, leaving marginal part 32 of annular shape. The bores 17' are formed in the marginal part 32. It is further understood that each bore 17' has formed therein the dielectric layer 23, electroconductive layer 24 and filling 25, all shown in FIG. 2, substantially as they are in the trench 17. The reverse guard ring 14, FIG. 2, is formed just inside the row of bores 17'.

The spacings between the bores 17' may be so determined as to be filled by the depletion layer 26, indicated by the broken line in FIG. 6, when the pn junction 15, FIG. 1, is reverse biased with a voltage in excess of a predetermined limit. The row of bores 17' will then function in combination like the trench 17. Each bore 17 need not be circular in cross sectional shape but may, for example, be square or rectangular.

Figure 7:
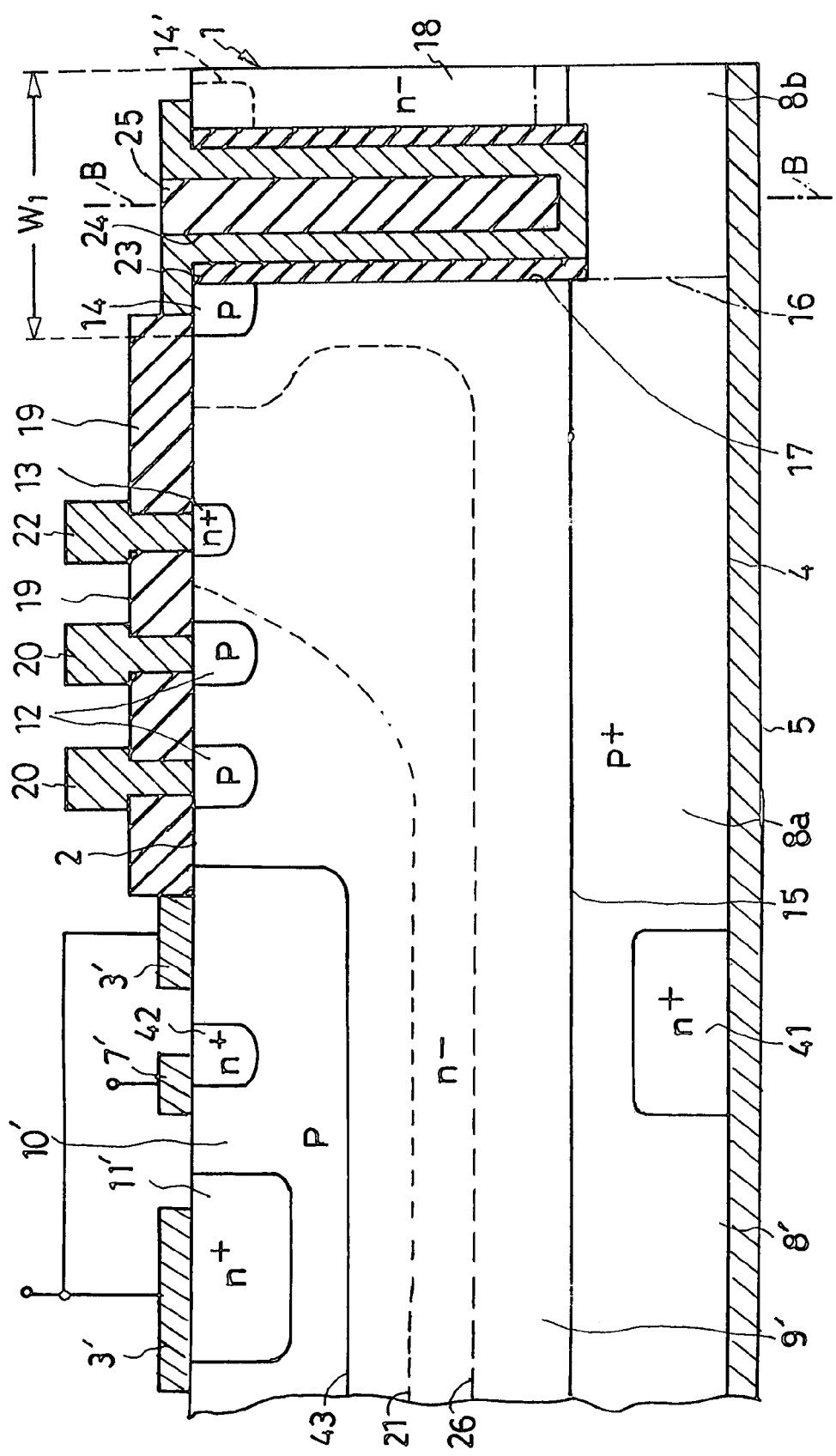
FIG. 7 is a view similar to FIG. 2 but showing a three-terminal bidirectional thyristor embodying the principles of this invention.

Embodiment of FIG. 7

The invention is applicable to a TRIAC, or TRIode for Alternating Current, a bidirectional electronic switch approximately equal to two silicon controlled rectifiers or thyristors interconnected in inverse-parallel and with their gates joined together. FIG. 7 shows, in a sectional view similar to FIG. 2, the TRIAC chip of improved strength against both forward and reverse voltages according to the invention. The TRIAC chip has the substrate 1 having formed therein:

1. A first semiconductor region 8' of p$^+$ type exposed at the second major surface 4 of the substrate.

2. A second semiconductor region 9' of n$^-$ type overlying the first semiconductor region 8' and exposed at the first major surface 2 of the substrate.

3. A third semiconductor region 10' of p type formed islandlike in the second semiconductor region 9' and extending from the first major surface 2 of the substrate toward the second 4 and terminating short of the first semiconductor region 8'.

4. A fourth semiconductor region 11' of n$^+$ type formed islandlike in the third semiconductor region 10' and extending from the first major face 2 of the substrate toward the second 4 to a depth less than that of the third semiconductor region 10'.

5. A fifth semiconductor region 41 of n⁺ type formed islandlike in the first semiconductor region 8' and exposed at the second major surface 4 of the substrate, the fifth semiconductor region 41 being at least partly out of register with the fourth semiconductor region 11'.

6. A sixth semiconductor region 42 of n⁺ type formed islandlike in the third semiconductor region 10' and positioned to permit triggering for both forward and reverse conduction.

The TRIAC chip further comprises:

1, A first main electrode 3' formed on the first major face 2 of the substrate 1 and electrically coupled to both third semiconductor region 10' and fourth semiconductor region 11'.

2. A second main electrode 5 formed on the second major surface 4 of the substrate 1 and electrically coupled to both first semiconductor region 8' and fifth semiconductor region 41.

3. A gate electrode 7' formed on the first major surface 2 of the substrate 1 and electrically coupled to both third semiconductor region 10' and sixth semiconductor region 42.

The TRIAC chip is akin to the IGBT chip of FIGS. 1 and 2 in the other details of construction. Thus the TRIAC chip is additionally furnished with the p-type forward guard rings 12, n⁺-type channel limiter ring 13, p-type reverse guard ring 14, and trench 17 with its internal structures 23-25.

Constructed as in the foregoing, the TRIAC chip according to the invention operates just like its conventional counterpart. It does, however, possess the following functional and constructional advantages over the prior art:

1. The pn junction 43 between second semiconductor region 9' and third semiconductor region 10' does not have its perimeter exposed at the sides of the substrate 1 but at its first major surface 2.

2. The pn junction 15 between first semiconductor region 8' and second semiconductor region 9' is made stronger against higher reverse voltages than heretofore by the trench 17 with its internal structures 23-25.

3. The pn junction 43 is made more voltage-resistant than heretofore by the forward guard rings 12 and channel limiter ring 13.

Possible Modifications

Notwithstanding the foregoing detailed disclosure it is not desired that the present invention be limited by the exact showings of the drawings or the description thereof. The following is a brief list of possible modifications, alterations or adaptations of the illustrated embodiments of the invention which are all believed to fall within the purview of the claims annexed hereto:

1. An n⁺-type buffer region of sufficiently small thickness could be interposed between collector region 8 and base region 9 of the preferred IGBT chips disclosed herein, as indicated by the dot-and-dash line labeled 28 in FIGS. 2-5.

2. The individual cells of the IGBT chips could have their base regions isolated from one another by trenches for still higher strength against forward voltages, as taught by Japanese Unexamined Patent Publication No. 2003-243655.

3. The instant invention is applicable to semiconductor devices other than IGBTs and TRIACs, such other devices including a two-terminal bidirectional thyristor which is equivalent to the three-terminal bidirectional thyristor of FIG. 7 minus the gate electrode 7' and sixth semiconductor region 42.

4. The forward guard rings 12, FIGS. 2-7, will function as field-limiting rings without the electrodes 20.

5. As long as any chosen semiconductor device is made stronger against reverse voltages by the teachings of this invention, it may be done so against forward voltages by virtue of the known field plate effect rather than the guard ring or field limiting effect.

6. The trench 17 could cross sectionally taper toward its bottom rather than being constant in width throughout its depth.

7. The parts of the illustrated IGBT and TRIAC chips on the outside of the line B-B in FIGS. 2-4 and 7 could be removed.

8. The parts of the FIG. 6 IGBT chip on the outside of the notional line joining the centers of the bores 17' could likewise be removed.

9. The electroconductive layer 24 could be out of contact with the reverse guard ring 14 in all the embodiments disclosed.

10. The electroconductive layer 24 might be turned into a resistive field plate by imparting a desired degree of resistance thereto and causing a weak current to flow therethrough.

11. The trench 17 with its internal structures is applicable to the boundaries between the individual devices of an integrated circuit.

12. The additional reverse guard rings 27 of FIG. 3 is applicable to the FIGS. 4-7 embodiments.

13. The second reverse guard ring $14_a$ of FIG. 4 is applicable to the FIGS. 3, 6 and 7 embodiments.

14. The upper trench portion $17_a$, the lower trench portion $17_b$, the dielectric layers $23_a$ and $23_b$, and the electroconductive layer 24' of FIG. 5 are applicable to the FIGS. 3, 6 and 7 embodiments.

15. The bores 17' of FIG. 6 are applicable to the FIGS. 3-5 embodiments.

What is claimed is:

1. A semiconductor chip of improved voltage-withstanding capability, comprising:
    (a) a semiconductor substrate having a first and a second major surface and a set of side surfaces therebetween;
    (b) a first semiconductor region of a first conductivity type formed in the substrate and exposed at the second major surface thereof;
    (c) a second semiconductor region of a second conductivity type, opposite to the first conductivity type, formed in the substrate and exposed at the first major surface thereof;
    (d) there being a junction of opposite conductivity types between the first and the second semiconductor region;
    (e) there being an annular trench formed in the first major surface of the substrate and extending through the second semiconductor region into the first semiconductor region;
    (f) a first electrode on the substrate electrically coupled to the second semiconductor region;
    (g) a second electrode on the substrate electrically coupled to the first semiconductor region;
    (h) a dielectric layer received in the trench and held against the second semiconductor region; and
    (i) an electroconductive layer received in the trench and placed against the second semiconductor region via the dielectric layer, the electroconductive layer being electrically coupled to the first semiconductor region;
    (j) whereby, when the opposite-conductivity-type junction between the first and the second semiconductor region of the substrate is reverse biased, the electroconductive layer creates in the second semiconductor region a depletion layer which is joined to a depletion layer created in the second semiconductor region by the opposite-conductivity-type junction, thereby preventing current leakage from the side surfaces of the substrate.

2. A semiconductor chip of improved voltage-withstanding capability as defined in claim 1, wherein the substrate has further formed therein a guard ring of the first conductivity type placed inwardly of the trench.

3. A semiconductor chip of improved voltage-withstanding capability as defined in claim 1, wherein the substrate has further formed therein:
 (a) a first guard ring of the first conductivity type placed inwardly of the trench and exposed at the first major surface of the substrate; and
 (b) a second guard ring of the first conductivity type placed inwardly of the trench and spaced from the first guard ring toward the second major surface of the substrate.

4. A semiconductor chip of improved voltage-withstanding capability as defined in claim 1, wherein the trench is formed by a row of bores extending parallel to each other, the bores having spacings from one to another which are sufficiently small as to be filled by the depletion layer created in the second semiconductor region when the junction between the first and the second semiconductor region of the substrate is reverse biased.

* * * * *